(12) United States Patent
Worley

(10) Patent No.: US 6,757,381 B1
(45) Date of Patent: Jun. 29, 2004

(54) DESIGN OF TELEPHONE LINE INTERFACE CIRCUITS USING A TWO CHIP OPTO-COUPLER WITH LEDS INTEGRATED ONTO SILICON CHIPS

(76) Inventor: Eugene Robert Worley, 11 Bowditch, Irvine, CA (US) 92620

(*) Notice: Subject to any disclaimer, the term of this patent is extended or adjusted under 35 U.S.C. 154(b) by 0 days.

(21) Appl. No.: 09/375,772

(22) Filed: Aug. 17, 1999

Related U.S. Application Data

(60) Provisional application No. 60/096,405, filed on Aug. 13, 1998.

(51) Int. Cl.[7] .......................... H04M 1/00; H04M 9/00; H01L 31/12; H01L 31/16
(52) U.S. Cl. ............................. 379/399.01; 379/93.05; 379/413.04; 375/220; 257/81; 257/84; 257/99
(58) Field of Search .......................... 379/399.01, 405, 379/413.02, 413.04, 93.05, 93.15; 257/81, 82, 83, 84, 99; 375/220, 222

(56) References Cited

U.S. PATENT DOCUMENTS

| | | | | |
|---|---|---|---|---|
| 5,086,454 A | * | 2/1992 | Hirzel | 379/98 |
| 5,224,154 A | * | 6/1993 | Aldridge et al. | 379/93 |
| 5,280,526 A | * | 1/1994 | Laturell | 379/405 |
| 5,369,687 A | * | 11/1994 | Farkas | 379/98 |
| 5,438,210 A | * | 8/1995 | Worley | 257/82 |
| 5,465,298 A | * | 11/1995 | Wilkison et al. | 379/406 |
| 5,481,606 A | * | 1/1996 | Andrieu et al. | 379/399 |
| 5,500,895 A | * | 3/1996 | Yurgelites | 379/412 |
| 5,528,686 A | * | 6/1996 | Cwynar et al. | 379/405 |
| 5,552,328 A | * | 9/1996 | Orlowski et al. | 437/23 |
| 5,555,293 A | * | 9/1996 | Krause | 379/98 |
| 5,655,010 A | * | 8/1997 | Bingel | 379/93.28 |
| 5,717,752 A | * | 2/1998 | Whitney | 379/399 |
| 5,734,703 A | * | 3/1998 | Hiyoshi | 379/98.28 |
| 5,751,803 A | * | 5/1998 | Shpater | 379/379 |
| 5,774,541 A | * | 6/1998 | Krause | 379/405 |
| 5,875,235 A | * | 2/1999 | Mohajeri | 379/93.36 |
| 5,946,393 A | * | 8/1999 | Holcombe | 379/399 |
| 6,128,373 A | * | 10/2000 | Mathe et al. | 379/93.29 |
| 6,226,331 B1 | * | 5/2001 | Gambuzza | 375/258 |
| 6,285,706 B1 | * | 9/2001 | Skinker et al. | 375/222 |
| 6,304,597 B1 | * | 10/2001 | Dupuis et al. | 375/222 |
| 6,351,533 B1 | * | 2/2002 | Parrott | 379/412 |
| 6,359,973 B1 | * | 3/2002 | Rahamim et al. | 379/93.05 |
| 6,365,951 B1 | * | 4/2002 | Worley | 259/438 |
| 6,385,235 B1 | * | 5/2002 | Scott et al. | 375/220 |
| 6,389,061 B1 | * | 5/2002 | Scott et al. | 375/220 |

\* cited by examiner

*Primary Examiner*—Binh Tieu

(57) ABSTRACT

Design techniques are describes in which a telephone interface circuit or DAA can be realized using two silicon integrated circuits which include integrated opto couplers. The LED is formed on the chips using technologies which can be easily integrated onto a silicon integrated circuit such as porous silicon, avalanching PN junction, forward biased PN junction, deposited silicon carbide PN junction, deposited organic LED material such as conjugated polymers, or deposited GaAs LEDs. The light detector is realized using either a PN junction based detector or a Schottky diode detector depending on the wavelength of the light transmitted by the LED. The two integrated circuits can be placed in a single package with suitable optical links within the package. This technology thus eliminates the need for discrete opto couplers and transformers.

7 Claims, 4 Drawing Sheets

DESIGN OF TELEPHONE LINE INTERFACE CIRCUITS USING A TWO CHIP OPTO-COUPLER WITH LEDS INTEGRATED ONTO SILICON CHIPS

CROSS-REFERENCE TO RELATED APPLICATION

Provisional Application No. 60096405 Filing Date Aug. 13, 1998.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

1. Field of the Invention

This invention is directed to circuits that interface a telephone line to a MODEM and to AC powered telephones and are fabricated using integrated circuit techniques and silicon based LEDs.

2. Prior Art

Isolation between the telephone line and AC house powered telephone circuits require an isolation barrier. Specifically, answering machines, cordless telephones, speaker phones, FAX machines, and MODEMs require the use of an electrical supply powered by a 60/50 Hz AC source which cannot be electrically connected to the telephone line through a hard wired connection. The ground of the AC powered circuit must be allowed to float with respect to the telephone line. To couple signals between the telephone line and an AC powered circuit a number of isolation devices can employed including transformers, capacitors, and opto-couplers. In addition, relays may also be employed to act as electrically isolated control switches such as an off hook switch in a MODEM. The interface circuit between the telephone line and an AC line powered circuit is referred to as a Data Access Arrangement or DAA.

Traditionally, signal isolation has been accomplished by using a 600 Ohm transformer. The biggest drawbacks in using transformers, however, are size and cost. Capacitors can be used as isolation devices but add undesirable capacitance between the isolated circuits unless the capacitance is very small, i.e. on the order of a few pico-farads. Also, capacitively isolated circuits are susceptible to transient disturb if the ground bus of one of the isolated circuits sees a rapid voltage change with respect to the ground bus of the second isolated circuit. This effect is due to the fact that a capacitor must pass charge from the output of one circuit to the input of the other circuit if the ground bus voltage difference between the two circuits changes. Finally, capacitively coupled telephone isolation circuit complexity increases over that using a transformer. However, with integrated circuit technology this disadvantage is greatly reduced.

The disturb problem associated with capacitively coupled signal isolation is not present in optically coupled signal isolation. Like the capacitively coupled isolator, the optically coupled isolator requires more circuitry than does a transformer coupled isolator.

In the traditional MODEM DAA which uses a transformer for signal isolation an opto coupler is employed for ring detection and a relay for the off hook condition. A Darlington connected bipolar transistor pair is typically used to sink the off hook current while providing a high signal impedance.

With the ability to provide complex circuits at a low cost, it is feasible to eliminate the bulky transformer and replace it with either an isolation capacitor or an opto coupler. This was illustrated in U.S. Pat. No. 5,438,210 which showed how SOI combined with silicon based LEDs could be use to fabricate a monolithic DAA. One difficulty with this approach is the lack of general acceptance of SOI technology and the high cost of the substrate material.

Other inventions show how opto couplers can be used in a discrete circuit format to perform the isolating function. The opto couplers in these inventions use commercially available opto-couplers which are based on GaAs technology for the LED and silicon for the detector technology. The problem with these approaches is the cost of making a circuit with several discrete integrated circuits.

SUMMARY OF THE INSTANT INVENTION

This invention relates to an optically isolated DAA which eliminates the traditional signal isolation transformer. Applications include MODEMs, FAX machines, and AC line powered telephones such as but not limited to speaker phones, cordless telephones, and telephone answering machines.

It is the objective to show how even low efficiency LEDs can be used eliminate the signal transformer and how to integrate components that have traditionally been discrete. In particular, traditional discrete LEDs such as GaAs diodes can be replaced either with low efficiency silicon based diodes such as porous silicon, avalanche diodes, deposited silicon carbide diodes, etc. or with deposited polymer light sources or even deposited GaAs LEDs. LEDs that are placed directly onto the silicon integrated circuit will lower the cost over discrete LEDs. Furthermore, unlike that of U.S. Pat. No. 5,438,210, this invention seeks to unitize bulk silicon technology which is much more available and lower in cost than SOI technology. The key to using low efficiency LEDs is to digitally encode the signal and transmit it across the optically coupled barrier as a series of digital pulses rather than as an analog signal. This removes the stringent requirement of linearity and phase integrity needed for the analog signal, especially as it applies to MODEMs.

It is another object of this invention to reduce the number of LED-light detector pairs to two for off hook and ring signaling in addition to signal coupling. It is another objective to show how a MODEM DAA can be realized using only two silicon chips in a single package. And another objective is to show how a speaker phone, a voice messaging phone, and a cordless phone can be realized using two silicon chip circuits.

PRIOR ART STATEMENT

U.S. Pat. No. 5,369,687. This patent describes an opto coupler based DAA which uses a D to A and an A to D converter on the telephone line side to drive the transmit and receive opto couplers. Two additional couplers are shown for the ring signal and the off hook signal.

U.S. Pat. No. 5,465,298. This patent uses opto couplers to transmit and receive the telephone signal. Transmission through the opto couplers is direct with an additional light detector use as a feedback sensor to improve linearity of the opto coupler.

U.S. Pat. No. 5,555,293. This patent show a "transhybrid that incorporates optically-coupled isolation stages". Optical coupling is by analog means with analog feedback using a second detector.

U.S. Pat. No. 5,528,686. This patent shows another example of a linear opto coupler based telephone line interface.

U.S. Pat. No. 5,751,803. This patent shows a method of AC coupling both the tip and ring signals into a transmit optocoupler U.S. Pat. No. 5,500,895. This patent is an example of a capacitive type telephone line isolation DAA.

U.S. Pat. No. 5,086,454. This patent shows the building blocks of and analog type opto-coupler based DAA for a MODEM.

U.S. Pat. No. 5,224,154. This patent shows a microcontroller based DAA which uses opto-couplers to transmit the data signals and the ring signal.

DESCRIPTION OF THE PREFERRED EMBODIMENT

Figure 1:
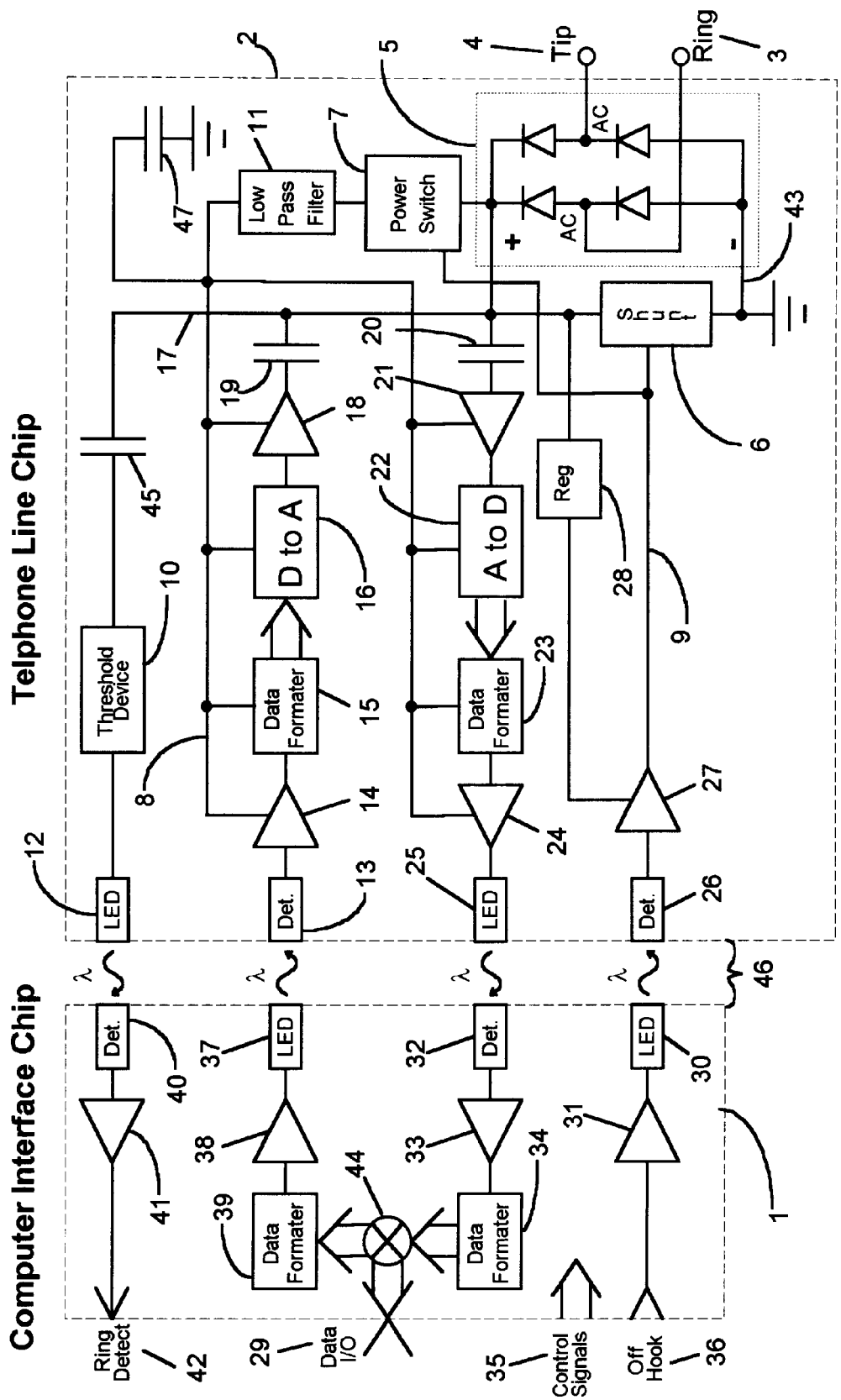
FIG. 1 shows a diagram of an MODEM interface circuits comprised of two silicon integrated circuits which are mounted in a single package and use LEDs which are fabricated on the silicon chips.

FIG. 1 is a diagram of the preferred embodiment of a MODEM DAA which is comprised of 2 silicon integrated circuits; one 1 which interfaces to a host computer or MODEM controller and a second 2 which interfaces to the telephone line. The two chips can be housed in a single package which provides an internal optical path between the two chips. Referring to FIG. 1, the Tip 4 and Ring 3 terminals of the telephone line connect to a bridge rectifier circuit 5. The + terminal 17 of the bridge rectifier 5 connects to several terminals including a low current regulator 28, an off hook shunt/regulator 6, a receive signal coupling capacitor 20, a transmit coupling capacitor 19 and a ring signal coupling capacitor 45. The shunt 6 is used to both pull down the telephone line from 48 V to signal an off hook condition to the central office and to provide a regulated DC voltage such as 5 V to power the various circuits interacting with the telephone line. A power switch 7 is used to connect the regulated telephone line power to the circuit once the voltage is at a safe value. The power switch is enabled by the off hook control signal 9. To guarantee that the signal circuits such as the A to D converter 22 do not see high voltages such as the ring signal the power switch 7 must include a high voltage disable function.

To present a high impedance to the signal from the telephone line the shunt device 6 operates as a current source. For the telephone line power provided to the circuits of chip 2 a low pass filter 11 is used so that the telephone line signal present on node 17 is not attenuated. A filter capacitor 47 is connected from the circuit power line 8 to ground 43 and may be external to chip 2 if power supply bypassing requires a large capacitance. The power line 8 supplies a number of chip 2 circuits including digital logic, analog to digital and digital to analog converters, and analog amplifiers/buffers.

The signal transmit path for Telephone Interface Chip 2 starts with an optical connection from the Computer Interface Chip 1 to chip 2. The Computer Interface Chip 1 transmits the data signal via modulated light using an "on chip" LED 37 while the Telephone Interface Chip 2 receives the light using an "on chip" light detector 13. The on chip LED can be a standard silicon junction diode operated in the forward bias mode which emits light with a photon energy corresponding to the energy of the silicon bandgap, a standard silicon junction diode operated in the avalanche mode which emits light in the visible region, a deposited silicon carbide diode which emits light in the visible region, a porous silicon LED which emits light in the visible region, a deposited GaAs LED which emits light near the visible region, or a light emitter which uses plastic and emits light in the visible region. The detector 13 on Telephone Line Chip 2 can be a standard PN junction silicon diode or a floating base bipolar transistor if the light source is visible or a Schottky barrier diode if the light photon energy is at the bandgap of silicon. Of the LED-detector pairs mentioned, the standard PN junction silicon diode operated in the avalanche mode and a standard PN junction diode used as the detector are the easiest to implement in that no special or non standard silicon processing is required. The next easiest combination is the forward biased silicon diode as the LED and the Schottky barrier diode as the detector. After the latter combination the next easiest is the porous silicon LED and the standard PN junction diode as the detector. The last two LEDs require the deposition of materials onto the silicon substrate.

The detector 13 outputs a weak signal which is amplified by 14 to a logic level signal which is fed to the Data Formatter 15. The Data Formatter 15 takes the serial data stream and converts it to an appropriate format for the D to A converter 16. This format is typically an 8 bit word or byte at a data rate of 8,000 bytes per second. The D to A converter 16 takes the data and converts it to an analog signal. The D to A converter 16 uses a companding algorithm appropriate for a given telephone system standard. The output from the D to A converter 16 is then fed to an analog driver 18 which drives the node 17 via a coupling capacitor 19. Node 17 connects the signal to the telephone line via the bridge rectifier 5.

For the receive path the telephone line signal is picked up off of node 17 via capacitor 20 which blocks the DC voltage on node 17. The signal is then magnified by amplifier 21 and then passed to the A to D converter 22. The A to D converter 22 will typically output a byte at a data rate of 8,000 bytes per second. The A to D converter 22 uses a companding algorithm appropriate for a given telephone system. The output of the A to D converter 22 is then passed to the Data Formatter 23 which formats the data into a serial format. The output of the Data Formatter 23 is fed to the LED buffer/driver 24 which feeds the serial data signal to the LED for transmission across the isolation barrier 46.

The circuit controlling the off hook status includes a light detector 26 which receives its signal from an LED 30 which is controlled by the computer via an input 36. The detector 26 signal is then amplified by 27 and fed to the control line 9 which turns the shunt 6 on or off control and to the on/off control of the power supply switch 7. When enabled by the control line 9, the shunt will pull the node 17 down which in turn signals the central office by drawing current through the Tip 4 and Ring 3 terminals. Also, when the shunt 6 is turned on the power supply switch 7 is also turned on providing power to various circuits including amplifiers, converters, and drivers.

The off hook amplifier 27 is a low power amplifier which receives its power from a special low current regulator 28. Regulator 28 does not pull down the DC telephone line voltage since it is designed to draw only a small current on the order of a few micro-amps for the amplifier 27. Thus, amplifier 27 is powered in the on hook state so that it can respond to the command to go off hook. Given the fact that the response of the off hook circuit can be slow allows very low power circuits to be used.

The ring signal is detected by noting that it produces a large pulsating DC voltage on node 17. This voltage is fed into a capacitor 45 which filters out the DC component of this signal. A threshold device 10 such as a Zener diode is used detect the large amplitude of the ring signal by allowing current to flow into the ring LED 12. The ring signal is then transmitted across the isolation barrier 46 via light emitted from LED 12.

Not shown in the diagram of FIG. 1 is an oscillator in chip 2 which provides timing for the logic circuits.

The Computer Interface Chip 1 deals with four principle signal components including the transmit data signal, the receive data signal, the ring signal, and the off hook signal.

For data transmission, a bi-direction port 29 is used to receive data from the host computer. This port can either be a parallel port or a serial port. The data is then sent via a tristate I/O buffer to the transmit data formatter 39 which puts the data in a serial format. An LED buffer 38 drives the transmit LED 37 which sends the data across the isolation barrier 46 via light pulses. These pulses are then changed to electrical pulses, formatted, and then converted to an analog signal for transmission to the telephone line.

For receiving data, detector 32 is used to receive the light pulses containing the data being received from the telephone line. The pulses are amplified by 33 and are then sent to the data formatter 34 which converts the serial stream of data into a format appropriate for the computer. For the case shown in FIG. 1 the format is assumed to be parallel data which is fed to a tristate I/O buffer 44. The data is then ported 29 to the computer bus for processing.

The off hook command signal 36 is input from the computer and then sent to a buffer/driver 31 which drives the LED 30. LED 30 then sends a light signal across the isolation barrier 46 so that the Telephone Line Chip 2 can initiate an off hook condition on the telephone line 3,4.

To detect a telephone ring condition a light detector 40 on the Computer Interface Chip 1 receives the light generated from LED 12 on the Telephone Line Chip 2 in response to the large amplitude AC ring signal present on the telephone line 3,4. The signal from the detector is amplified by 41 and then sent out to the host computer via chip terminal 42.

Control signals from the host computer are input on port 35. This port supplies operational codes such as setting the mode of the tri-state buffer 44. Also, an op code via this port can be used in lieu of the off hook port 36 to set the off hook condition.

Figure 2:
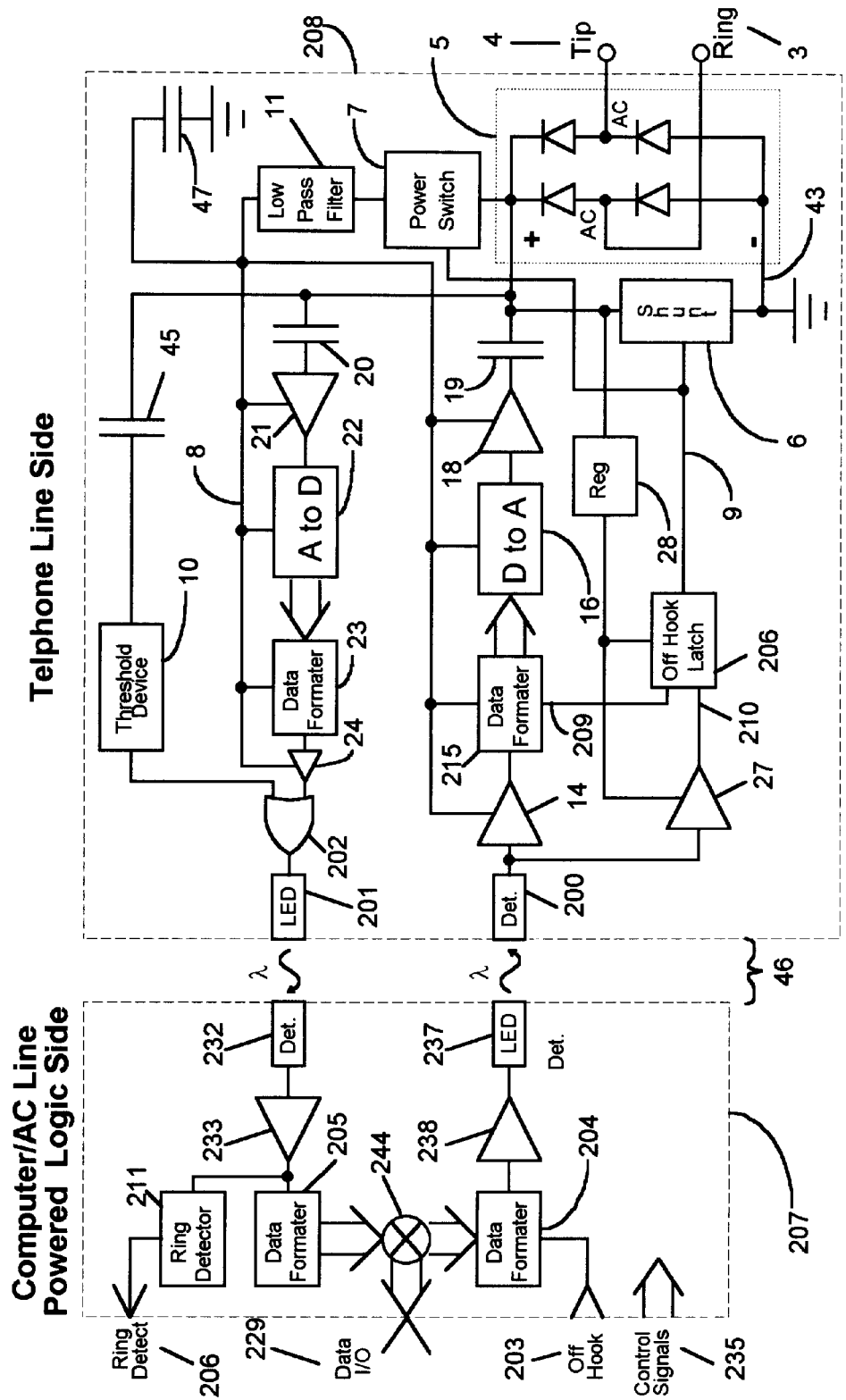
FIG. 2 is similar to that of FIG. 1 except that the ring signal and off hook signal have been integrated into the signal path thereby eliminating two LEDs-detector pairs associated with the ring signal and the off hook signal.

FIG. 2 is a block diagram of a MODEM DAA circuit similar to FIG. 1 except that two LED-detector pairs are used instead of four. The reduction in LED-detector pairs facilitates packaging and perhaps lower power at the expense of more circuitry. In the diagram shown in FIG. 2 the ring LED-detector pair, 12 and 40 of FIG. 1, is shared with the signal receive path LED-detector pair, 201 and 232. Also, FIG. 2 shows that the off hook LED-detector pair, 30 and 26 of FIG. 1, is shared with the signal transmit path LED-detector pair, 200 and 237.

The ring signal which appears as a large amplitude pulsating DC voltage is applied to the signal LED through an analog "and" gate 202. As before, capacitor 45 removes the DC loop voltage of the central office and the threshold device 10 is used to pass only a large amplitude signal. The low frequency ring signal is passed to detector 232 via LED 201 and then the received signal is amplified by 233. The low frequency ring pulsing is detected by the Ring Detector 211 which is basically a low pass filter. Upon identifying a ring signal the Ring Detector 211 will notify the MODEM processor or host processor of the ring condition via terminal 206.

The off hook activity begins with the MODEM or host processor initiating a command via the off hook terminal 203. The Data Formatter 204 then sends an off hook signal to the buffer 238 which drives the transmit LED 237. Next, the light signal from LED 237 is detected by 200. A "no op" or off hook code can be transmitted which does not cause the Data Formatter 215 to output data to the D to A converter 16. Amplifier 27 which is powered by the low current regulator 28 amplifies the signal and then outputs a logic enabling signal 210. Regulator 228 is similar in operation to regulator 28 of FIG. 1 except that it also powers a low power Off Hook Latch 206. Once received, the logic enabling signal 210 sets the Off Hook Latch 206 in the "off hook state" which then turns "on" the shunt regulator 6 and the Power Switch 7.

The Off Hook Latch 206 is reset or set in the "on hook" state by a code sent from the Data Formatter 204 in response from an on hook command from the MODEM processor or host processor via terminal 203. The code is deciphered by the Data Formatter 215 and a reset command is sent to the reset terminal 209 of the Off Hook Latch 206 which shuts off the Shunt Regulator 6 and the Power Switch 7.

Thus, with some additional logic, two LED detector pairs are eliminated in the circuit described in FIG. 2 over that of FIG. 1. Also, of the 4 LED-detector pairs of FIG. 4 it is possible to eliminate only one of the LED-detector pairs if desired using the aforementioned techniques. Thus, using methods described herein it is possible to have three LED-detector pairs with either the ring signal combined with the data receive signal or the off hook signal combined with the data transmit signal.

Figure 3:
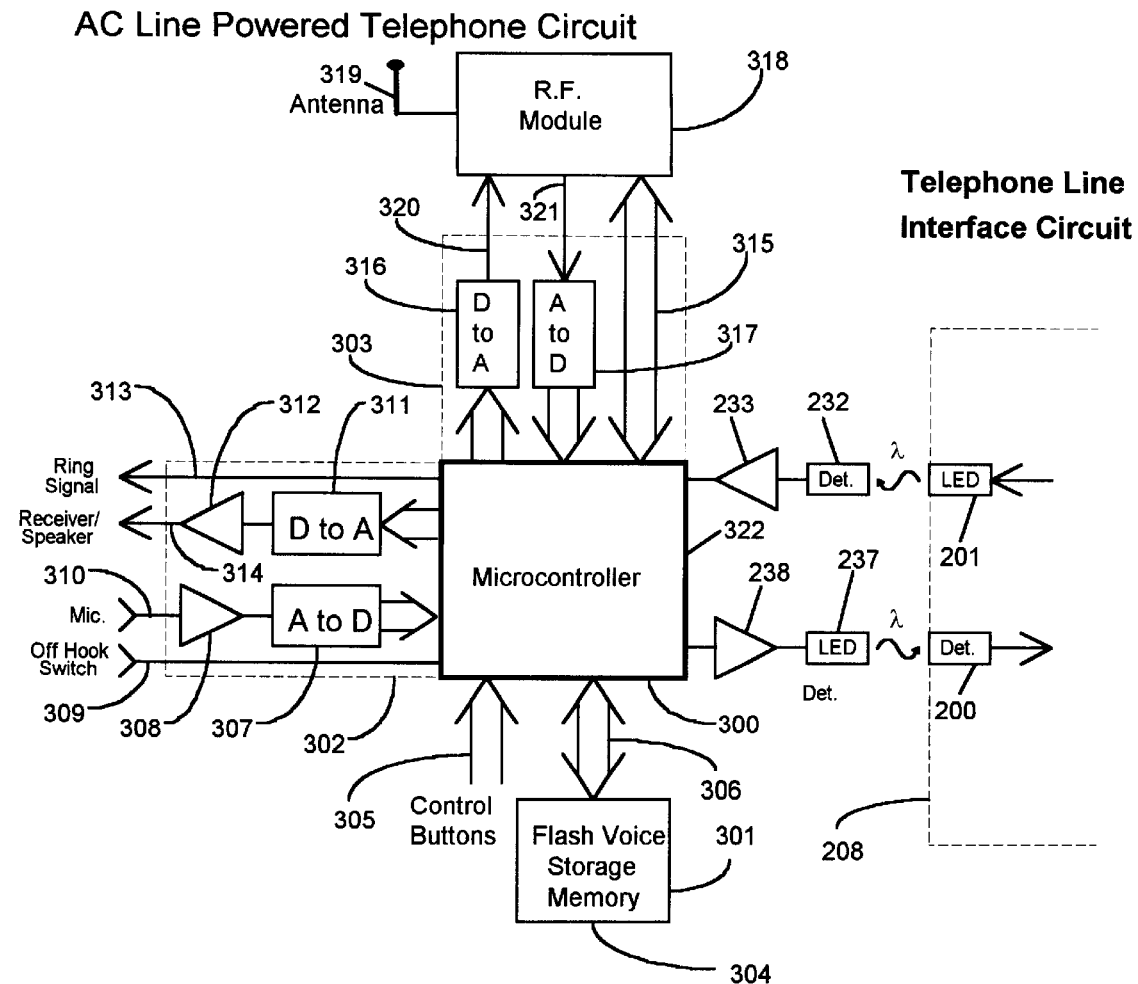
FIG. 3 shows a diagram of a telephone circuit with a speaker phone, voice message recorder, and a cordless phone capability using the two silicon integrated circuits mounted in a single package.

FIG. 3 shows a block diagram of a house AC powered telephone circuit which can interface to the telephone line. The diagram shows three types of telephone operations requiring house AC power: a powered speaker phone, a cordless phone, and a voice message recording phone. Two bulk silicon chips are used, one to interface to the telephone line and the other to humans and the AC house line power. The telephone line interface circuit is the same as that used for the MODEM. In the case of FIG. 3 the two LED-detector pair telephone interface circuit 208 of FIG. 2 is used. Although not shown, the 4 LED detector circuit can also be used or even a three LED detector pair version as mentioned earlier.

The transmit and receive audio signals, the ring signal, and off hook signal are all controlled by a central mirco-controller 300. Thus, the audio signals are controlled or manipulated in digital format. The transmit and receive audio signals are sent and received, as before, in a serial data stream format via the LED-detector pairs, 201, 232 and 237, 200. The receive data stream is received by the microcontroller via the amplifier 233 and the transmit data stream is sent out to the LED driver 238 by the microcontroller 300.

For the speaker phone or head set monitor for the voice recording phone an audio interface module 302 is added including an A to D converter 307 and a D to A converter 311 which are used to convert the audio signals into digital data. An interface audio amplifier 312 is used between the D to A converter 311 and the speaker or headset earphone which is hooked up via terminal 314. An audio amplifier 308 is also used between the A to D converter 307 and the microphone via terminal 310. The off hook switch terminal 309 feeds directly into the microcontroller 322. The ring signal 313 connects to a piezoelectric buzzer or the equivalent. A control button interface 305 is provided for such functions as volume, squelching, etc. The microcontoller then controls the data moving back and forth between the telephone line and the acoustic transducers. Also, if a math coprocessor is added to the microcontroller, filtering functions can be added such as echo cancellation.

For the cordless phone applications, another audio module 303 is used. This module includes an A to D converter 317, a D to A converter 316, and a control interface bus 315 going from the external R.F. module 318 to the microcontroller. Thus, the "microphone"terminal 321 of the external R.F. module and the earphone terminal 321 of the R.F. module connect to the on chip converters 316 and 317. If the R.F. module 318 transmits data in digital format, then the A to D converter 317 and the D to A converter 316 are not necessary. The output of the R.F. module is an antenna 319.

Another provision is a data/address bus 306 for interfacing the microcontroller 300 to an external flash memory or solid state non volatile memory chip 304 so that an answering machine can be created. Again, a math coprocessor may have to be included in the microcontroller 322 for handling data compression required for efficient digital voice storage. Also, additional lines on the control button bus 305 are required to handle the buttons associated with the human-answering machine interface.

Figure 4:
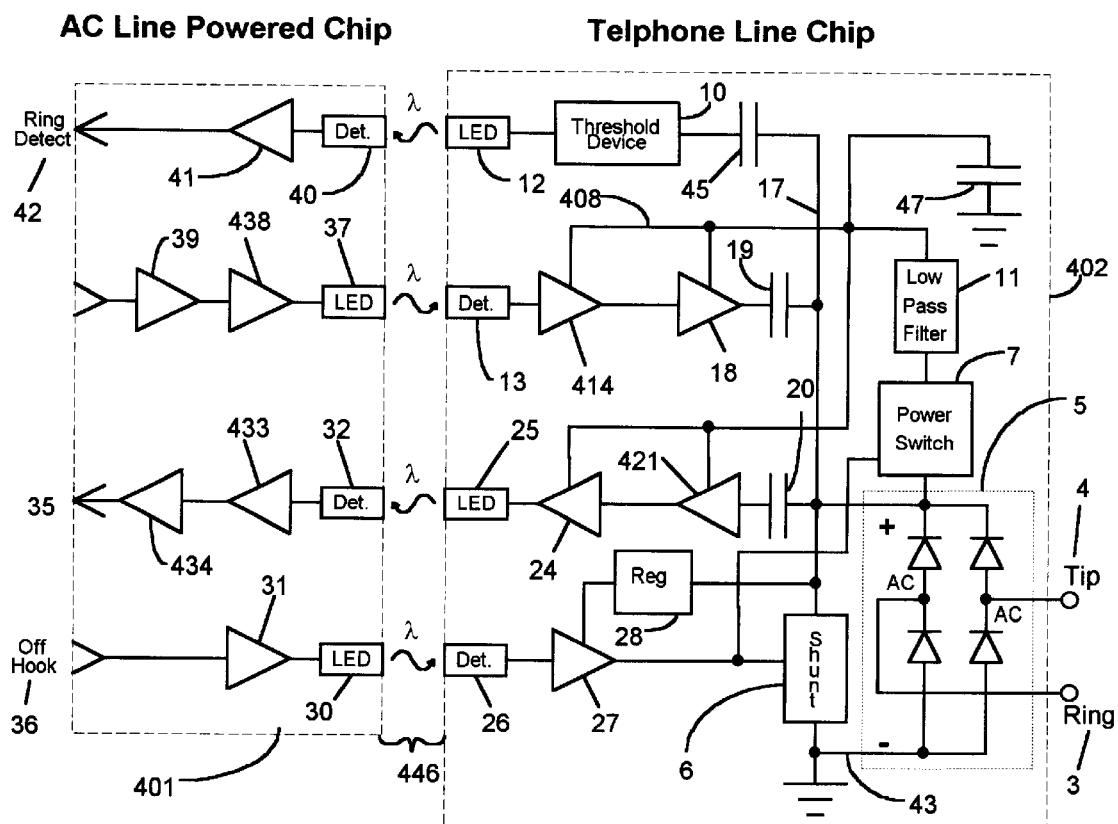

For powered telephone applications where excellent linearity is not required it is possible to simplify the DAA design as shown in FIG. 4. In this design analog signals rather than digital pulses are propagated through the LEDs. Note that most of the functional elements of the Telephone Line Chip 402 are the same as those found in the Telephone Line Chip 2 of FIG. 1. The D to A and A to D converters have been replaced, however, with analog amplifiers such as 421 and 414.

Because of the dynamic range advantages of compressing an analog signal such as logarithmic amplification, amplifier 421 which is in the receive path can be designed, as an option, to compress the signal before its optical transmission across the transparent insulation barrier 446. Correspondingly, amplifier 433 decompress the signal if the signal is compressed. In the case of logarithmic compression, amplifier 433 would have an exponential gain characteristic. Amplifier 24 is a buffer amplifier and is used to drive LED 25. Amplifier 434 is a buffer amplifier and is used to drive an earphone, speaker, etc. For a speakerphone application, two buffer amplifiers may be required; one to drive an earphone and one to drive a loudspeaker.

The transmit path of FIG. 4 starts with amplifier 439 which receives a signal from microphone. This amplifier may also incorporate a compression means to improve the dynamic range of the transmit path. 438 is a buffer used to drive LED 37 which transmits the analog signal across the transparent insulating barrier 446. Light detector 13 receives the light signal and then feeds the corresponding electrical signal into amplifier 414. If the signal is compressed, then 414 can decompress the signal as well as amplify it. Buffer 18 is used to take the signal and drive the telephone line via coupling capacitor 19.

It should be noted that some linear opto couplers use a feedback diode to obtain a highly linear transfer characteristic. Most potential candidates for LEDs which can be made on silicon chips, however, have poor efficiencies and therefore make this approach more difficult to implement given that the light beam must fed into two rather than one detector; i.e. one detector to receive the signal which is on a chip different from the chip containing the LED and a second detector to provide feedback which is on the chip containing the LED. Also, the two detectors should be well matched but must reside on two different chips. Hence, the difficulty in using this approach.

Fortunately, one promising approach for implementing an LED on silicon is the avalanche silicon PN junction diode. Although its quantum efficiency is low its output is very linear with drive current and, therefore, makes a good candidate for implementing the telephone circuit depicted in FIG. 4.

It is worth noting that the two silicon chip DAA concepts shown herein can also be extended to video phones and FAX machines. In fact, the MODEM DAAs described in FIG. 1 and FIG. 2 can also directly apply to FAX machines.

In conclusion, it is possible to create a two silicon chip DAA without the need for transformers, discrete opto-couplers, and capacitors. It is shown that "On" silicon chip LEDs and light detectors can be used to realize a DAA with a reduced number of external components.

I claim:

1. A Data Access Arrangement comprising two chips housed in one package, wherein chip 1 interfaces with a computer or modem and chip 2 interfaces with a telephone line;

one of an on chip LED of chip 1 coupled optically to an on chip light detector of chip 2 and a plurality of on chip LEDs of chip 1 coupled optically to corresponding on chip light detectors of chip 2;

one of an on chip LED of chip 2 coupled optically to an on chip light detector of chip 1 and a plurality of on chip LEDs of chip 2 coupled optically to corresponding on chip light detectors of chip 1;

a data formatter to convert a serial data stream into a digital data stream in a format appropriate for a D to A converter;

a D to A converter;

an A to D converter; and a data formatter to convert a digital data stream of data into a serial data stream in a serial format;

wherein data streams transmitted from the LED of one chip to the light detector of another chip are digital data streams.

2. The Data Access Arrangement of claim 1 wherein the on chip LED is one of a standard silicon junction diode operated in the forward bias mode, a porous silicon LED that emits light in the visible region, a deposited silicon carbide diode that emits light in the visible region, a deposited GaAs LED that emits light in the visible region, and a light emiter that uses plastic and emits light in the visible region.

3. The Data Access Arrangement of claim 1 wherein the on chip LED is a low efficiency LED.

4. The Data Access Arrangement of claim 1 wherein a circuit controlling the off hook status in chip 2 includes a light detector that receives a light signal via an optical path from an LED on chip 1, wherein the LED on chip 1 is controlled by an input and the light detector in chip 2 and the LED on chip 1 form pair 1; and a ring detector in chip 1 includes a light detector on chip 1 that receives a light signal generated by an LED on chip 2, wherein the LED on chip 2 generates the light signal in response to a large amplitude AC ring signal present on a telephone line and the light detector on chip 1 and the LED on chip 2 form pair 2.

5. The Data Access Arrangement of claim 4 wherein an LED-light detector pair serves as a signal receive path LED-light detector pair;

and an LED-light detector pair serves as a signal transmit path LED-light detector pair.

6. The Data Access Arrangement of claim 5 wherein one of pair 1 is shared with the signal receive path LED-light detector pair and pair 2 is shared with the signal transmit path LED-light detector pair.

7. The Data Access Arrangement of claim 1 wherein the data formatters are eliminated;

the A to D converter is replaced with an analog amplifier;

the D to A converter is replaced with an analog amplifier;

the digital data streams are replaced with analog data streams; and the data streams transmitted from the LED of one chip to the light detector of another chip are not digital data streams.

* * * * *